(12) United States Patent
Beletsky (10) Patent No.: US 6,681,377 B2
(45) Date of Patent: Jan. 20, 2004

(54) TIMING RESYNTHESIS IN A MULTI-CLOCK EMULATION SYSTEM

(75) Inventor: Platon Beletsky, Sunnyvale, CA (US)

(73) Assignee: Quickturn Design Systems, Inc., San Jose, CA (US)

( * ) Notice: Subject to any disclaimer, the term of this patent is extended or adjusted under 35 U.S.C. 154(b) by 0 days.

(21) Appl. No.: 10/246,788

(22) Filed: Sep. 17, 2002

(65) Prior Publication Data

US 2003/0084414 A1 May 1, 2003

Related U.S. Application Data (60) Provisional application No. 60/323,490, filed on Sep. 18, 2001.

(51) Int. Cl.[7] ............................................. G06F 17/50
(52) U.S. Cl. .................. 716/6; 716/2; 716/5; 703/27
(58) Field of Search ........................ 716/2, 5, 6; 703/27

(56) References Cited

U.S. PATENT DOCUMENTS

| | | | |
|---|---|---|---|
| 5,036,473 A | | 7/1991 | Butts et al. |
| 5,109,353 A | | 4/1992 | Sample et al. |
| 5,259,006 A | | 11/1993 | Price et al. |
| 5,452,239 A | | 9/1995 | Dai et al. |
| 5,475,830 A | | 12/1995 | Chen et al. |
| 5,715,172 A | * | 2/1998 | Tzeng ............................ 716/6 |
| 5,960,191 A | | 9/1999 | Sample et al. |
| 6,134,516 A | * | 10/2000 | Wang et al. ................... 703/27 |
| 6,321,366 B1 | * | 11/2001 | Tseng et al. ..................... 716/6 |

OTHER PUBLICATIONS

Gated–Clock Optimization of FPGA Technology Mapping; W Dai, L Galbiati, D. Bui; Published in the Asia EDAC conference, in 1996.

* cited by examiner

Primary Examiner—Vuthe Siek
Assistant Examiner—Thuan Do
(74) Attorney, Agent, or Firm—Orrick, Herrington & Sutcliffe LLP (57) ABSTRACT

A method for resynthesizing gated clocks in a clock cone of a logic design having more than one input clock where the logic design will be implemented in a hardware logic emulation system. By resynthesizing the gated clocks, timing in the circuit becomes predictable. In the method, predicting logic that predicts which edges of said at least two input clocks may cause a hold time violation on a gated clock is generated. Then, the outputs from the predicting logic are connected to a gated clock resolution circuit, which outputs the resynthesized clock.

3 Claims, 10 Drawing Sheets

TIMING RESYNTHESIS IN A MULTI-CLOCK EMULATION SYSTEM

RELATED APPLICATIONS

This application claims the benefit of U.S. Provisional Application Serial No. 60/323,490, filed on Sep. 18, 2001. The contents of U.S. Provisional Application Serial No. 60/323,490 are incorporated herein by reference in their entirety.

FIELD OF THE INVENTION

The field of the invention relates generally to hardware logic emulation systems used for verification of integrated circuit and electronic system designs and more particularly to an method of improving the timing characteristics of such a hardware logic emulation system.

BACKGROUND OF THE INVENTION

Hardware logic emulation systems are known devices that implement a user's design in a plurality of programmable integrated circuits. Such logic emulation systems are available from various vendors, including Quickturn Design Systems, Inc., San Jose, Calif., United States of America, which is the assignee of the present invention. Typical emulation system utilize either programmable logic chips or processor chips which are programmably interconnected. In either case, the user's design must be partitioned into smaller portions. In programmable logic chip (e.g., field programmable gate array, or FPGA) based emulation systems, the logic contained in the user's design is programmed into the logic chip. In processor-based emulation systems, the user's design is processed so that its functionality appears to be created in the processors by calculating the outputs of the design. The logic itself is not implemented in a processor-based emulation system. Examples of hardware logic emulation systems can be seen in, e.g., U.S. Pat. Nos. 5,109,353, 5,036,473, 5,475,830 and 5,960,191. U.S. Pat. Nos. 5,109,353, 5,036,473, 5,475,830 and 5,960,191 are incorporated herein by reference.

The user's design is usually provided in the form of a netlist description of the design. A netlist description (or "netlist", as it is referred to by those of ordinary skill in the art) is a description of the integrated circuit's components and electrical interconnections between the components. The components include all those circuit elements necessary for implementing a logic circuit, such as combinational logic (e.g., gates) and sequential logic (e.g., flip-flops and latches). In prior art emulation systems such as those manufactured and sold by Quickturn Design Systems, Inc., San Jose, Calif., the netlist is compiled such that it is placed in a form that can be used by the emulation system. Thus, after compilation, the netlist description of the user's design has been processed such that an "emulation netlist" is created. An emulation netlist is a netlist that can be programmed into the programmable resources of the emulation system.

The timing characteristics of the user's logic design is very important to the design and is given a tremendous amount of attention during the design phase. The timing characteristics of that same design when programmed into the hardware logic emulation system, however, is often changed from the timing characteristics of the design. Many factors contribute to this phenomenon, but the largest contributor is the fact that the user's design is partitioned and implemented in many different integrated circuits. Thus, while a user's design may be for a single integrated circuit chip, the emulator may implement that same design on hundreds of programmable chips. Such an implementation dramatically increases the amount of wiring and overhead associated with a design. Thus, clock paths become much larger and complicated when the user's design is implemented in a hardware logic emulation system. Moreover, a user's design often has multiple clocks, which complicates matters even further.

The most common clock error in an emulation system is the hold time violation. A hold time violation can occur if a transmitting device removes a data signal before a receiving device had properly saved it into a flip-flop or latch. Thus, the D input of a flip-flop must be stable for a short time both before and after a gating edge transition of the flip-flop's clock pin. The required time before clock transition is called the setup-time, and the required time after the edge transition is called the hold-time.

There are several prior art methods for attempting to eliminate, or at least, minimize hold time violations in emulation systems. In one such prior art method, an auxiliary flip-flop is placed at the data input of any storage element in the user's design. These flip-flops were clocked with a special signal that is synchronized and phase shifted relative to the design clocks. A problem with this prior art method is that it can be difficult to derive the delayed clock signal (i.e., the special signal) in a multiple clock design. Moreover, requiring the use a auxiliary flip-flops dramatically increases the size of the design that must be implemented in the emulator, which reduces the amount of user-logic that can be emulated. In addition, the emulation speed is reduced. Finally, such a method will not work for latch-based designs. Note that this method is disclosed in U.S. Pat. No. 5,259,006.

Another prior art method of reducing or eliminating hold time violations was to compile the design, determine which clock paths were experiencing hold time violations (which could be done using timing analysis tools), inserting delay elements into that delay path and recompiling the design. This method worked, but was cumbersome and slow. Examples of this method are disclosed in U.S. Pat. No. 5,475,830.

Yet another prior art method was an attempt to place the entire clock cone into a single chip. Every flip-flop input, as well as every design output, defines a cone. When the entire clock cone is placed in a single chip, the clock path delays t(C->C1), t(C->C2) consists entirely of the intra-chip delay with a low upper boundary approximation, which allows adding a relatively small additional data path delay without recompilation. Examples of this method are disclosed in U.S. Pat. Nos. 5,475,830 and 5,452,239.

Thus, while this prior art method improved on delay insertion, it is not without problems. One such problem with this method is that if the clock cone is too big, which is a common occurrence, the user is asked to prune the clock cone manually by marking the nets that are not really part of the clock path (i.e., clock qualifiers). Many user designs require substantial amounts of manual clock path pruning, which is undesirable. Additionally, there is no guarantee that this method will eliminate hold time violations.

As seen from the above, prior art methods of eliminating hold time violations were usually effective, but came at high cost. Thus, prior art methods developed to resynthesize the clock paths of the user's design. One such method was to switch from gated clock logic to clock-enable logic that is controlled by the input clock C directly. Like the other prior art methods, this method was very time and memory consuming. Another problem with this method was that it does not work with multiple input clocks that control the same gated clock.

There has been a long felt need for a method that automatically eliminates hold time violations that has guaranteed success. In addition, there has been a long felt need for a method that eliminates hold time violations without requiring the user to provide data that would characterize internal design nets, does not slow emulation speed, does not use too many resources (i.e., does not substantially reduce emulator capacity), and allows emulation of designs having multiple asynchronous clocks.

SUMMARY OF THE INVENTION

The present invention provides a novel method for resynthesizing gated clocks present in a logic design that will be programmed into a hardware logic emulation system to avoid hold time violations. A clock cone comprises a plurality of clock cone nets and at least one input clock. The logic design comprises a plurality data path nets. In one embodiment of the present invention, the method comprises generating predicting logic that predicts which edges of the at least one input clock may cause a hold time violation on a gated clock. Then, outputs from the predicting logic are connected to a gated clock resolution circuit. The gated clock resolution circuit outputs a resynthesized gated clock free of hold time violations.

In another embodiment of the present invention, the step of generating predicting logic comprises creating a bit field corresponding to each of the plurality of clock cone nets. The bit field comprises data fields indicating potential behavior of the corresponding net in response to a rising edge of the at least one input clock and a falling edge of said at least one input clock. A data path bit field is created that corresponds to each of the data path nets. The data path bit field comprises data fields indicating whether a positive edge of one of the at least one input clock may cause a change on the data path nets or whether a negative edge of one of the at least one input clock may cause a change on the data path nets. The bit field corresponding to each of the plurality of clock cone nets is compared with the data path bit field for each storage element in the logic design, thereby creating a future bit field. The future bit field contains data indicating whether a net is susceptible to a hold time violation for the particular edge of one of the at least one input clock or is not susceptible to a hold time violation for the particular edge of one of the at least one input clock. Predicting logic is then built for each net that is susceptible to a hold time violation.

The above and other preferred features of the invention, including various novel details of implementation and combination of elements will now be more particularly described with reference to the accompanying drawings and pointed out in the claims. It will be understood that the particular methods and circuits embodying the invention are shown by way of illustration only and not as limitations of the invention. As will be understood by those skilled in the art, the principles and features of this invention may be employed in various and numerous embodiments without departing from the scope of the invention.

BRIEF DESCRIPTION OF THE DRAWINGS

Reference is made to the accompanying drawings in which are shown illustrative embodiments of aspects of the invention, from which novel features and advantages will be apparent.

DETAILED DESCRIPTION OF THE DRAWINGS

Turning to the figures, the presently preferred apparatus and methods of the present invention will now be described.

Figure 1:
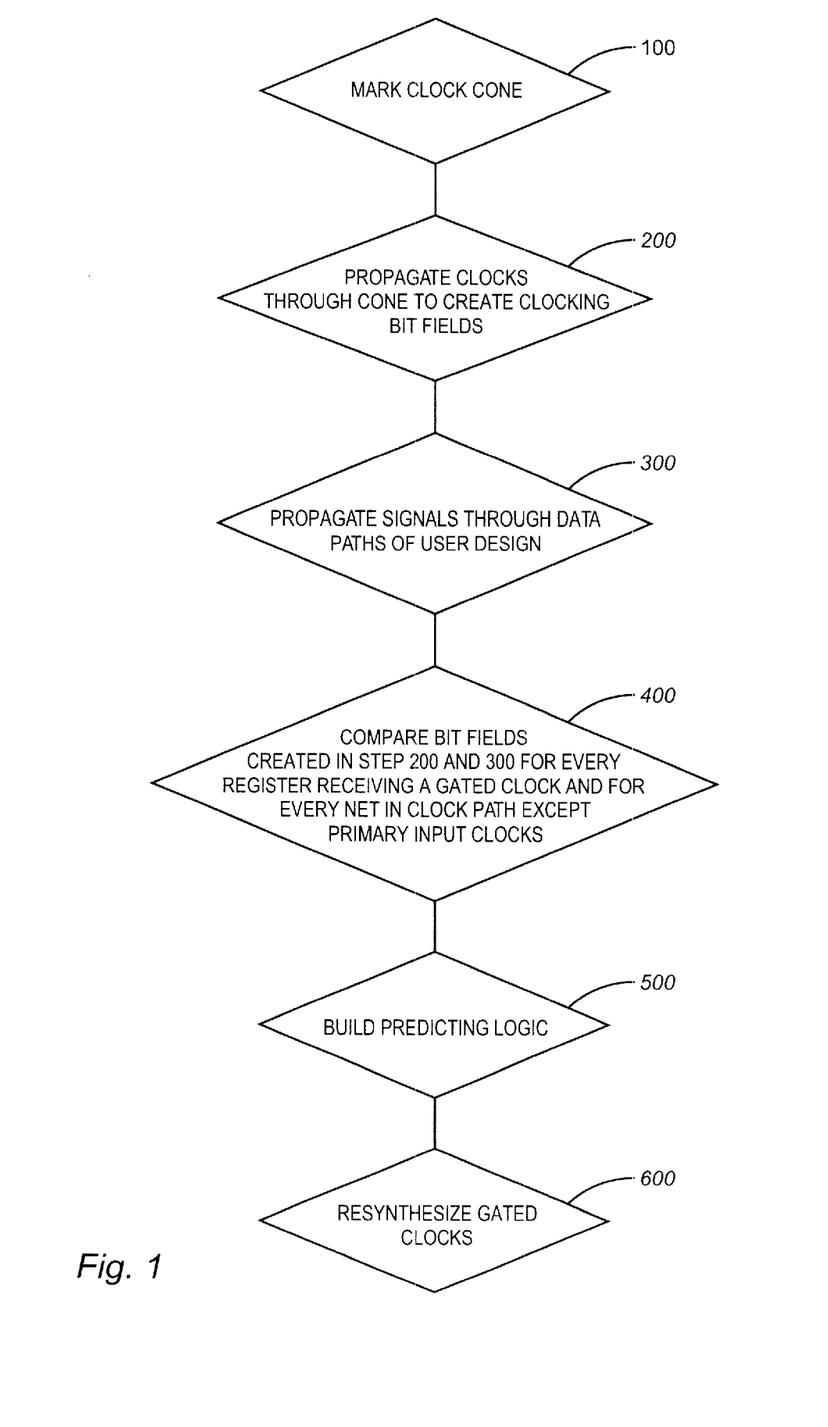
FIG. 1 is a flowchart showing how the presently preferred method of the various embodiments of the invention.
Figure 2:
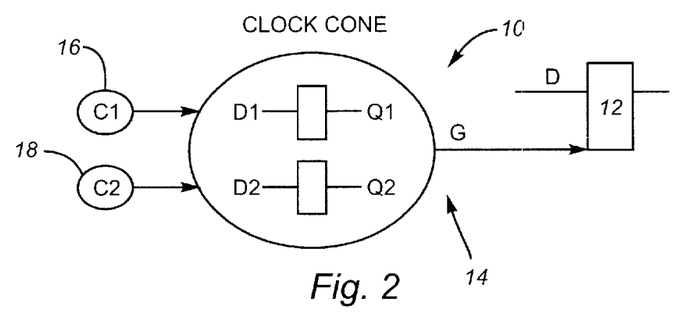
FIG. 2 is a schematic showing a logic circuit having a gated clock.

FIG. 1 is a flowchart showing a presently preferred method of the invention. The first step 100 shown in FIG. 1 is marking the clock cone. A simplified schematic of a generic logic circuit 10 is illustrated in FIG. 2. In this example, logic circuit 10 comprises a flip-flop 12 having a clock input and a data input. The clock input on flip flop 12 is connected to clock cone 14. Note that because there is logic in the clock cone 14, the clock input to flip-flop 12 is considered to be a gated clock. Clock cone 14 has two clock inputs 16 and 18, meaning that this particular circuit 10 comprises a clock cone with two input clocks. The input clocks are those clocks that are supplied by external sources, for example, a user's testbench or target system. It should be noted that the various embodiments of the present invention are not limited by the amount of logic in the clock cone or the number of input clocks, as the teachings herein work well regardless of these characteristics.

To mark a clock clone in step 100, the clock path, starting from the flip-flop 12 input, is back-traced, thereby going through all the combinational and sequential logic in a clock path until the clock inputs are reached. All of the combinational and sequential logic encountered in this traversal is in the cone corresponding to the starting flip-flop input. In the presently preferred embodiment, step 100 results a single clock cone being marked for the entire design. Of course, it is possible to use the teachings of the present invention with multiple clock cones for a given design.

As shown in FIG. 1, the second step 200 in this embodiment is to propagate input clock edges forward through the clock path in the clock cone 14. This is done by starting at the primary input clocks of the clock cone 14 determined in step 100, and propagating (e.g., traversing) the clock path through the combinational and sequential logic in the clock cone 14 until the gated clock of the flip-flop or latch at the end of the clock cone 14 is reached. Optionally, the clock signal can be propagated from set/reset inputs of the flip-flop or latch until the output of the flip-flop or latch is reached. The primary input clock is a clock input for the design and is specified by the user in the netlist (see clocks 16 and 18 in FIG. 2). Note that in the presently preferred embodiment, memories and "black boxes", i.e., circuit blocks with known functionality, are not propagated and are hence skipped. The same is true for clock paths through transparent latches.

During propagation step 200, each net that is traversed is marked with a 4*N mask (referred herein as a "bit field"), where N is the number of primary input clocks for the entire user design (the number of input clocks depends on the user's design). Thus, for each primary input clock, four bits of information is stored for each net. The purpose of each bit field is to examine the behavior of each net in four situations: (1) whether a negative edge may cause a negative edge on the output of this net; (2) whether a negative edge may cause a positive edge on the output of this net; (3) whether a positive edge may cause a negative edge on the output of this net; and (4) whether the positive edge on the input clock may cause a positive edge on the output of this net.

Figure 3:
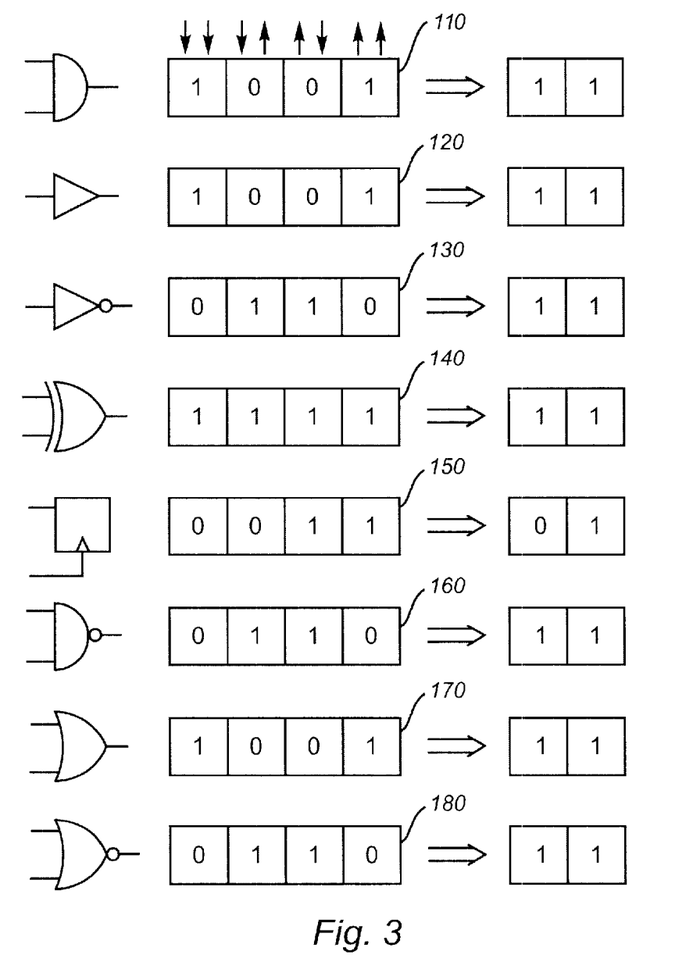
FIG. 3 is a chart showing various bit fields.

Examples of such bit fields can be seen in FIG. 3. Bit field 110 shows the bit field that would be created if the net traverses an AND gate. Bit field 120 shows the bit field that would be created if the net traverses a buffer. Bit field 130 shows the bit field that would be created if the net traverses an inverter. Bit Field 140 shows the bit field that would be created if the net traverses a EXCLUSIVE-OR gate. Bit field 150 shows the bit field that would be created if the net traverses a flip-flop. Bit field 160 shows the bit field that would be created if the net traverses a NAND gate. Bit field 170 shows the bit field that would be created if the net traverses an OR gate. Bit field 180 shows the bit field that would be created if the net traverses a NOR gate. The examples shown in FIG. 3 are not exhaustive, as the various nets might have inverted inputs and the like that could result in different bit fields. In the presently preferred embodiment, bit fields are stored on the host computer (not shown) that controls the emulator until they are needed.

After the four-bit bit fields 110–180 are created for each net in the clock cone 14, the four-bit bit fields are shrunk to a two-bit bit field so that only information as to whether the positive edge input may change the net or whether an negative edge input may change the net. This shrinkage is done by OR'ing the negative edge fields and OR'ing the positive edge fields. The result of this transformation is also seen in FIG. 3. This 2*N bit mask is referred to herein as Mclk, and is stored on the host computer that controls the emulator until they are needed. A "00" Mclk bit field is indicative of a net where no changes can take place on either a rising edge or falling edge of the input clock. A "01" Mclk bit field is indicative of a net that does not change on a falling edge of the input clock but may change on a rising edge of the input clock. A "10" Mclk bit field is indicative of a net that may change on a falling edge of the input clock but will not change on a rising edge of the input clock. Finally, a "11" Mclk bit field is indicative of a net that may change on both a rising edge or falling edge of the input clock.

The next step 300 in the method is to propagate all signals in the data path forward through the data path of the entire user design. In step 300, each signal is propagated through all logic, including memories and the like, which were ignored while tracing through the clock path. Unlike the case of the clock nets, the value on the nets that are traversed in the data path do not matter. All that matters is whether a clock edge (either rising or falling) may change the value of the net. Thus, each net is marked with a 2*N bit field, referred to herein as Mdata. Bit field Mdata is a two-bit bit field that contains information regarding whether a positive edge of the input clock may change the net or whether a negative edge of the input clock will change the net. In the presently preferred embodiment, bit fields Mdata are stored on the host computer that controls the emulator until they are needed.

The next step 400 shown in FIG. 1 is to iterate through all of the flip-flops and latches (i.e., all sequential logic gates) in the users design and to compare bit field Mclk for the flip-flop or latch's clock input with bit field Mdata for the flip-flop or latch's data input. In addition, step 400 comprises comparing the bit fields Mclk for every other net in the clock path (except for the primary clock input nets) that drives a gated clock with bit fields (future bit fields Mfut, described below). By performing these comparisons, the various embodiments of the present invention can predict which nets in the data path are susceptible to hold time violations.

The comparison conducted in step 400 is performed by AND'ing the Mclk bit field with the Mdata bit field for every register that received a gated clock. The result of this Boolean operation is a future bit field Mfut. If the Boolean operation Mclk AND Mdata results in a "0", then the net is not susceptible to hold time violations. Thus, a "0" in one of the fields of the future bit field Mfut means that this net is not susceptible to a hold time violation for the particular edge of the particular clock represented in that field. If, however, the Boolean operation Mclk AND Mdata results in a "1", there is the possibility of a hold time violation. Thus, a "1" in one of the fields of the future bit field Mfut means that there is the possibility of a hold time violation for the particular edge of the particular clock represented in that field. The reason for this is that such a result indicates that a data signal may arrive at the storage instance after the storage instance has received the rising clock signal because both the data input and clock input to the storage element may change as a result of a clock edge. In the presently preferred embodiments, for those nets where future bit field Mfut is all zeros, the bit field is ignored and not stored. Note that when a gated clock drives more than one sequential logic element, each field generated is OR'ed together to form a single future bit field Mfut.

As discussed, step 400 also comprises comparing the bit fields Mclk for every other net in the clock path that drives a gated clock (except for primary input clocks) with the future bit fields Mfut discussed above. Just as in the case of sequential logic elements that are driven by a gated clock, this comparison results in a future bit field Mfut. Future bit fields Mfut for nets driving gated clocks are created by AND'ing the Mclk bit field for the net driving a gated clock with the future bit field Mfut for the gated clock itself. This operation is repeated for each gated clock driven by the net driving the gated clock. After all of the AND operations are completed, all of the results of the AND operations are OR'ed together. Thus, for every gated clock "G", where "G" is driven by net "Q", future bit field Mfut for net "Q" is equal to (Mclk("Q") AND Mfut("G")) OR Mfut("Q"). As above, every "1" in the future bit field Mfut is indicative of a potential hold time violation.

Thus, for every net that is susceptible to a hold time violation, a two-bit bit field Mfut is created for each input clock. Future masks Mfut containing a "1" are indicative of a potential hold time violation.

The next step 500 shown in FIG. 1 is to construct predicting logic for the clock cone. Predicting logic constructed in step 500 is used to show the behavior of the clocking cone when the input clock triggers (i.e., rises or falls). For each net in the clock cone having a future mask Mfut, a copy is created (referred to herein as a "future" net) for every input clock. Note that each bit in the Mfut bit field corresponds to an edge on an input clock. This "future" net holds a predicted value for this net that will appear on this net if the corresponding input clock edge occurs. In other words, the various embodiments of the present invention create as many "future" nets as there are nonzero bits in the corresponding Mfut mask, meaning that there is one additional "future" net for every nonzero bit.

Figure 4A:
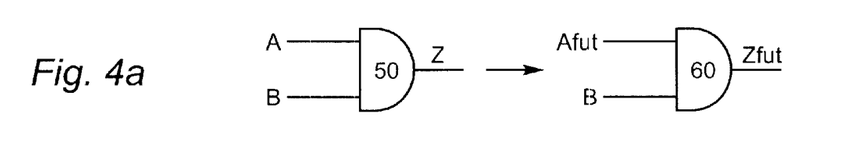
FIG. 4a illustrates how combinational gate driving a net susceptible to a hold time violation is copied to drive a "future" net.
Figure 4B:
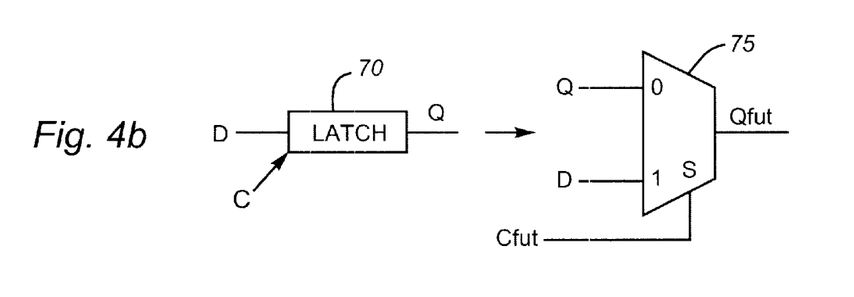
FIG. 4b illustrates the circuitry that is created to drive a "future" net when the user's design contains a latch driving a net susceptible to a hold time violation.
Figure 4C:
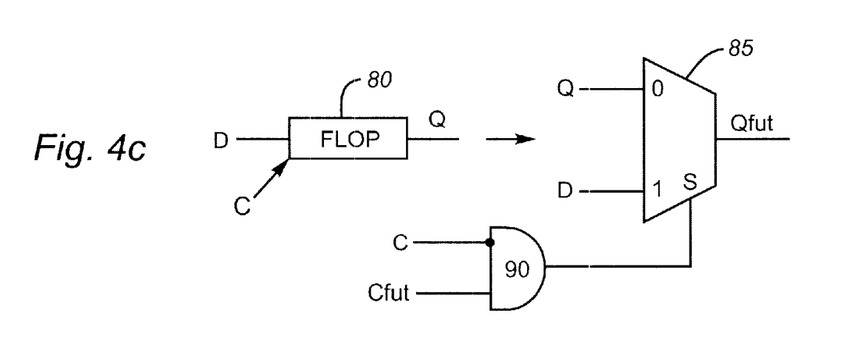
FIG. 4c illustrates the circuitry that is created to drive a "future" net when the user's design contains a flip-flop driving a net susceptible to a hold time violation.

Referring to FIGS. 4a–4c, the "future" nets that are created for each net susceptible to a hold time violation will now be discussed. If the original net in the user's design was driven by a combinational logic gate, the same type of combinational gate is created for its corresponding "future" net. Each input of this driver is connected to the corresponding "future" net. If an input to the combinational gate does not have a corresponding future net, it will be connected to the original net in the user's design. Referring to FIG. 4a, an example is provided showing how step 500 can be implemented. In this example, AND gate 50 is a combinational logic gate present in a user's netlist. Gate 50 has two inputs, net A and net B, and drives output, net Z. For this example, assume that net A has a "future" net (i.e., the corresponding bit is a "1") in the bit field Mfut but that net B does not have a "future" net. The "future" net is created by copying AND gate 50, i.e., creating AND gate 60. The copy of AND gate 50, AND gate 60, has the input A (the net having a "future" net) coupled to the future net Afut and the input B (the net without a "future" net) coupled to the same net, net B, as the original AND gate 50. The output of AND gate 60 is a future net that will be eventually connected to a clock resolution circuit (discussed below).

The "future" net created when the net susceptible to a hold time violation is driven by a latch or flip-flop are discussed in reference to FIGS. 4b–4c. The "future" net created when the net susceptible to a hold time violation is driven by a latch 70 is shown in FIG. 4b. When the net susceptible to a hold time violation is driven by a latch 70, a multiplexer 75 is created in the netlist. Latch 70 shown in FIG. 4b is driven by input "D", is clocked by clock "C" and has an output "Q". The "0" input of multiplexer 75 will be connected to the output "Q" of latch 70 in the user's netlist. The "1" input of multiplexer "75" will be connected to the input "D" of latch 70 in the user's netlist. The select input ("s") of multiplexer 75 will be connected to the future clock signal "Cfut". The output of multiplexer 75, which is the future output net of latch 70 ("Qfut"), will eventually be connected to the gated clock resolution circuit (described below).

It should be noted that "future" nets for any input clock "C" are known. This is because the input clocks (at their inputs) are not gated and are therefore completely predictable. Thus, the "future" net for a positive edge of the input clock is always a "1" while the future net for a negative edge of the input clock is always a "0". Thus, in this example where clock "C" is an input clock, on positive edge of "C", the input "D" to latch 70 will pass through the multiplexer 75 whereas on a negative edge of clock "C", the output "Q" of latch 70 will be output from multiplexer 75. In other words, on a positive edge of the input clock "C", multiplexer 75 turns into a buffer that connects the future net Qfut to latch 70 input "D", meaning that after a positive edge of the input clock "C", the predicted value for the output "Q" of latch 70 is its input "D".

The "future" net created when the net susceptible to a hold time violation is driven by a flip-flop 80 is shown in FIG. 4c. When the net susceptible to a hold time violation is driven by a flip-flop, a multiplexer 85 having a select input driven by an AND gate 90 is created in the netlist. Flip-flop 80 shown in FIG. 4c is driven by input "D", is clocked by clock "C" and has an output "Q". The "0" input of multiplexer 85 will be connected to the output "Q" of flip-flop 80 in the user's netlist. The "1" input of multiplexer 85 will be connected to the "D" input of flip-flop 80 in the user's netlist. The select input ("s") of multiplexer 85 will be connected to will be connected to the future clock signal "Cfut" output of AND gate 90. The first input to AND gate 90 is the inverse of the clock "C" that is input to flip-flop 80 of the user's netlist. The second input to AND gate 90 will be connected to the future clock signal "Cfut". The output of multiplexer 85, which is the future output net of flip-flop 80 ("Qfut"), will eventually be connected to the gated clock resolution circuit (described below).

Like the situation presented by latch 70 discussed above, "future" nets for any input clock "C" to flip-flop 80 are known. Thus, in this example where clock "C" is an input clock, on positive edge of "C", the input "D" to flip-flop will pass through the multiplexer 75 whereas on a negative edge of clock "C", the output "Q" of latch 70 will be output from multiplexer 75. In other words, on a positive edge of the input clock "C", multiplexer 75 turns into a buffer that connects the future net Qfut to latch 70 input "D", meaning that after a positive edge of the input clock "C", the predicted value for the output "Q" of latch 70 is its input "D".

Figure 5:
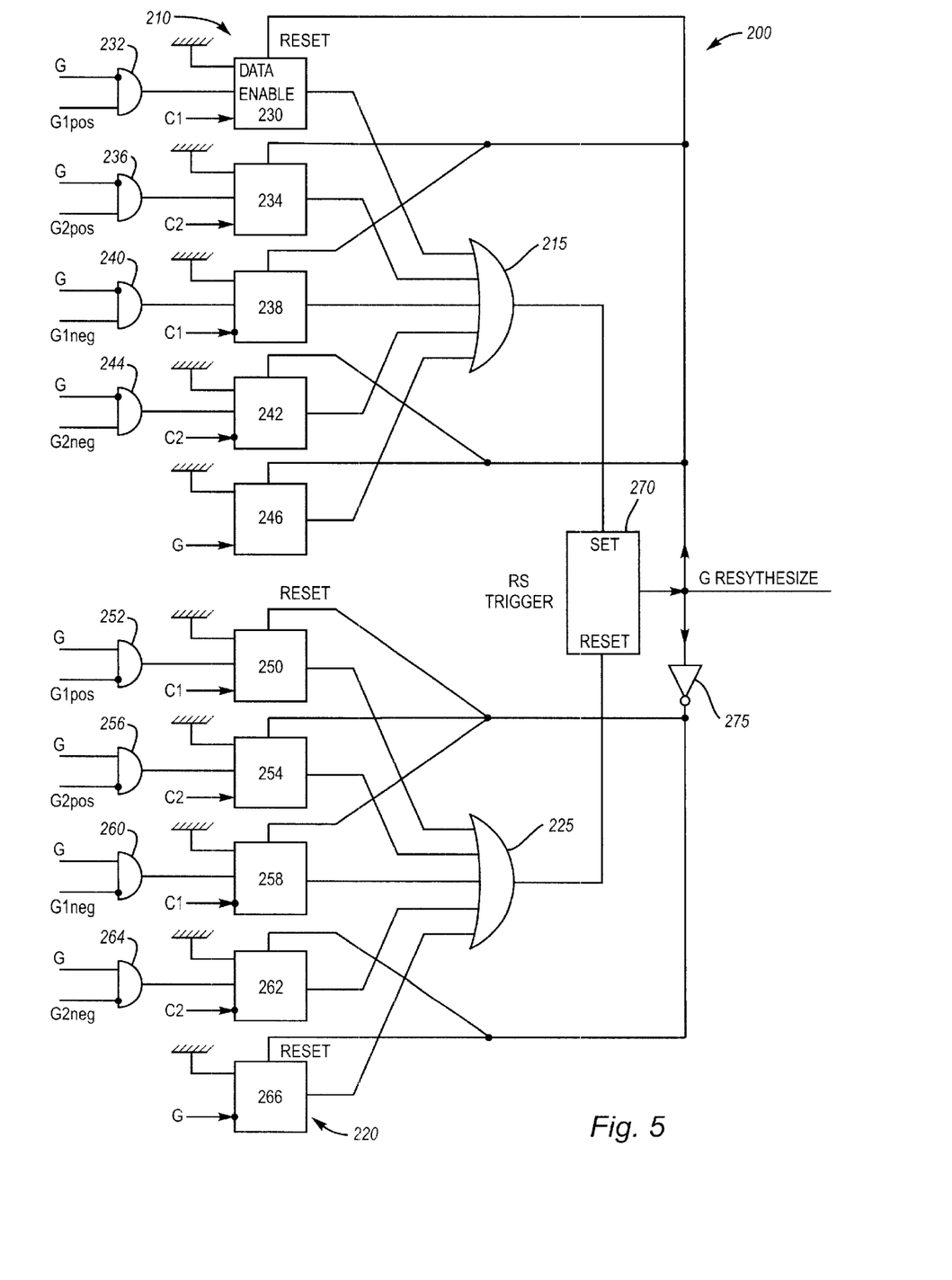
FIG. 5 is schematic an exemplary gated clock resolution circuit.

Once the predicting logic is generated in step 500, the various embodiments of the present invention re-synthesize the gated clocks, step 600 in FIG. 1, is to build a gated clock resolution circuit. The various embodiments of the present invention generate a gated clock resolution circuit 200 shown in FIG. 5. Gated clock resolution circuit 200 is comprised of a first group of flip-flops 210 that have their outputs coupled to a corresponding OR gate 215. Gated clock resolution circuit 200 is also comprised of a second group of flip-flops 220 that have their outputs coupled to a corresponding OR gate 225. The number of flip-flops in each group 210, 220 is dependent upon the number of input clocks. For each input clock, there will be two flip-flops in each group. Each group also has an additional flip-flop, the function of which will be described below. Thus, FIG. 5 shows an embodiment of gated clock resolution circuit 200 for a design having two input clocks.

Gated clock resolution circuit 200 will now be discussed in further detail. Gated clock resolution circuit 200 is comprised of flip-flop 230, flip-flop 234, flip-flop 238, flip-flop 242 and flip-flop 246. Flip-flop 230, flip-flop 234, flip-flop 238 and flip-flop 242 each have a data input, an enable input, a clock input and an output. Flip-flop 246 has a data input, a clock input and an output. The clock input on flip-flop 230 is the first input clock "C1". The clock input on flip-flop 234 is the second input clock "C2". The clock input on flip-flop 238 is the first input clock "C1". The clock input on flip-flop 242 is the second input clock "C2".

The enable inputs on flip-flops 230, 234, 238, 242 are each driven by AND gates 232, 236, 240, 244, respectively. AND gates 232, 236, 240, 240 preferably have two inputs and an output. The output of AND gate 232 is coupled to the enable input of flip-flop 230. One of the inputs to AND gates 232, 236, 240, 244 is the inverted gated clock from the original circuit "G" (i.e., the circuit to be emulated). Another input for AND gate 232 is the predicted signal "G1pos" for the positive edge on the first input clock "C1" from the predicting logic. Another input for AND gate 236 is the predicted signal "G2pos" for a positive edge on clock "C2" from the predicting logic. Another input for AND gate 240 is the predicted signal "G1neg" for the negative edge on the first input clock "C1". Another input for AND gate 244 is the predicted signal "G2neg" for the negative edge on the second input clock "C2". Predicted signals "G1pos", "G1neg", "G2pos" and G2neg" are outputs from predicting logic circuit.

Gated clock resolution circuit 200 is further comprised of flip-flop 250, flip-flop 254, flip-flop 258, flip-flop 262 and flip-flop 266. Flip-flop 250, flip-flop 254, flip-flop 258 and flip-flop 262 each have a data input, an enable input, a clock input and an output. Flip-flop 266 has a data input, a clock input and an output. The clock input on flip-flop 250 is the first input clock "C1". The clock input on flip-flop 254 is the second input clock "C2". The clock input on flip-flop 258 is the first input clock "C1". The clock input on flip-flop 262 is the second input clock "C2".

The enable inputs on flip-flops 250, 254, 258, 262 are each driven by AND gates 252, 256, 260, 264, respectively. AND gates 252, 256, 260, 264 preferably have two inputs and an output. The output of AND gate 252 is coupled to the enable input of flip-flop 230. One of the inputs to AND gates 252, 256, 260, 264 is the inverted gated clock from the original circuit "G" (i.e., the circuit to be emulated). Another input for AND gate 252 is the predicted signal "G1pos" for the positive edge on the first input clock "C1" from the predicting logic. Another input for AND gate 256 is the predicted signal "G2pos" for a positive edge on clock "C2" from the predicting logic. Another input for AND gate 260 is the predicted signal "G1neg" for the negative edge on the first input clock "C1". Another input for AND gate 264 is the predicted signal "G2neg" for the negative edge on the second input clock "C2". As discussed, predicted signals "G1pos", "G1neg", "G2pos" and G2neg" are outputs from predicting logic circuit.

The outputs of flip-flops 230, 234, 238, 242, 246 are input to OR gate 215. Likewise, the outputs of flip-flops 250, 254, 258, 262, 266 are input to OR gate 225. In the presently preferred embodiment, the output of OR gate 215 is input to the "set" input of RS trigger 270 while the output of OR gate 225 is input to the "reset" input of RS trigger 270. The output of RS trigger 270 is input to the "reset" inputs of flip-flops 230, 234, 238, 242, 246. The output of RS trigger 270 is inverted by inverter 275 and then input to the "reset" inputs of flip-flops 250, 254, 258, 262, 266.

As discussed, an additional flip-flop 266 forms a part of the gated clock resolution circuit 200. Flip-flop 266 is used for the optimizations (discussed below) of the gated clock resolution circuit 200. As will be discussed below, the gated clock resolution circuit can be optimized to only used those elements that are necessary. Normally, gated clock resolution circuit 200 does not need every one of the flip-flops 230–242, 250–262. The various embodiments of the present invention uses only those flip-flops 230–242, 250–262 that have corresponding nonzero bit in future bit field Mfut for the gated clock G. These flip-flops 230–242, 250–262 correspond to "resynthesized" (or "resolved") events (an event is an edge on an input clock). In the case of other nets where the various embodiments of the present invention established that there is no hold-time violation risk, it does not matter how fast or slow gated clock G will toggle. Thus, the various embodiments did not "resolve" this event for resynthesized gated clock. However, the resynthesized gated clock still must toggle so that it stays in sync with the original G.

The resynthesized gated clock is toggled with the help of G itself by using flip-flop 266. Thus, if a positive edge on gated clock G occurs, flip-flop 246 triggers and sets RS trigger 270 to "1", so that the resynthesized gated clock goes high in sync with G. On the other had, if a negative edge on G occurs, flip-flop 266 triggers and resets RS trigger 270 to "0", so that resynthesyzed gated clock goes low in sync with G.

Initially, each flip-flop 230, 234, 238, 242, 246, 250, 254, 258, 262, 266 of gated clock resolution circuit 200 are set to zero (i.e., each stores logic level "0"). In addition, the data inputs on each flip-flop 230, 234, 238, 242, 246, 250, 254, 258, 262, 266 are set to logic level "1".

It should be noted that the gated clock resolution circuit can be optimized if possible. Moreover, only those components that are needed will comprise the gated clock resolution circuit. For example, if predicting logic is only created for certain edges of certain input clocks, the number of components (e.g., AND gates and flip-flops) can be reduced.

Figure 6:
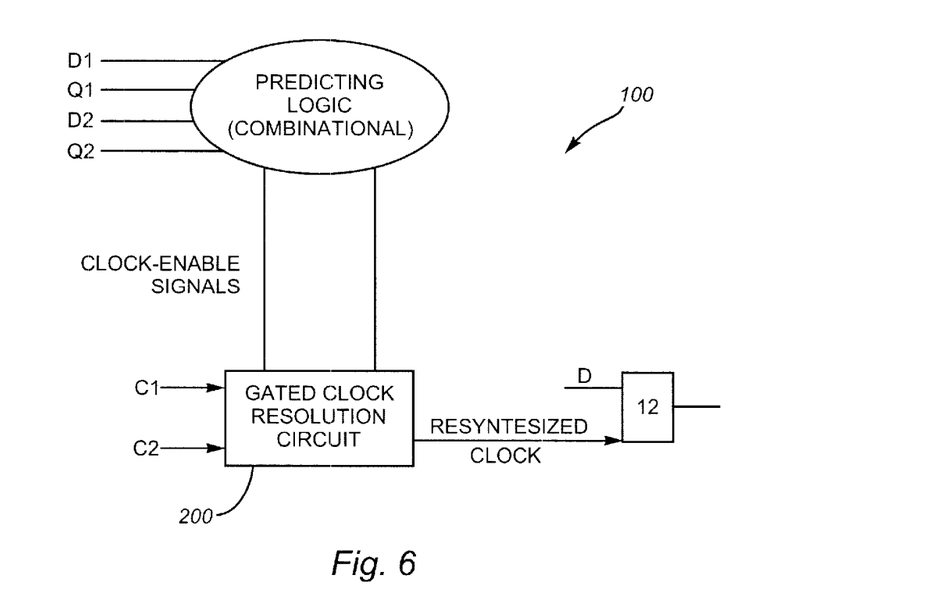
FIG. 6 is schematic showing an embodiment of a preferred embodiment of the present invention where predicting logic created by the various embodiments of the present invention is connected to a gated clock resolution circuit.

In sum, the various embodiments of the present invention use predicted signals output by predicting logic to drive enable signals (preferably through AND gates) on flip-flops used in the gated clock resolution circuit. The output of gated clock resolution circuit is a resynthesized clock signal. As is shown in FIG. 6, the resynthesized clock signal is input to the clock input of flip-flop 12, which, prior to clock resynthesis, was the output of the clock cone 14.

Figure 7:
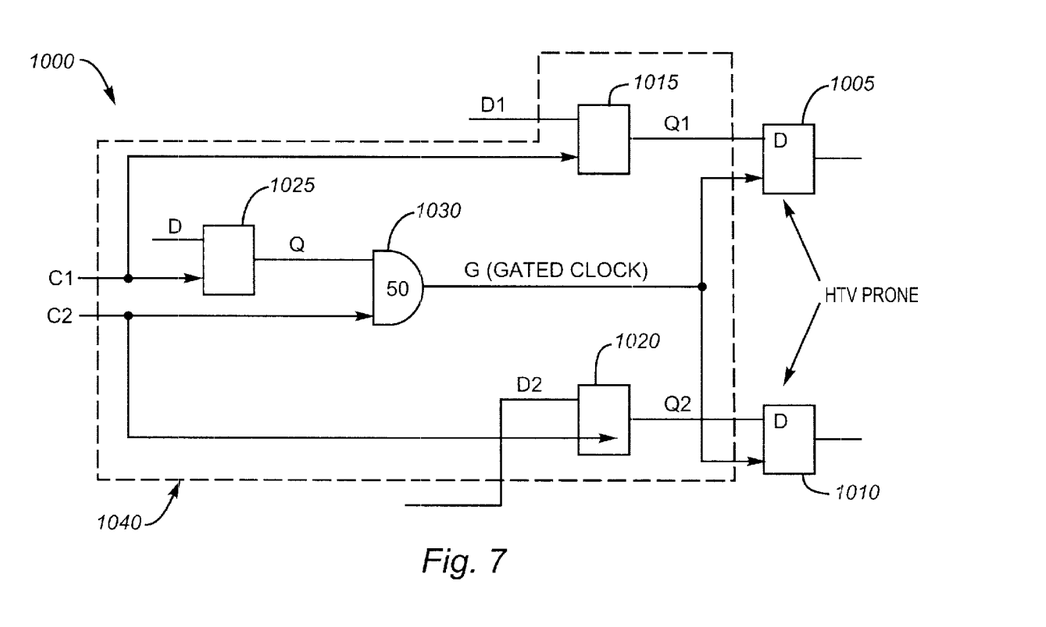
FIG. 7 is an exemplary circuit design that is used to describe a presently preferred embodiment of the present invention.

The operation of the present invention can be understood with reference to an example. FIG. 7 shows an exemplary circuit 1000. Circuit 1000 has a first input clock "C1" and a second input clock "C2". Circuit 1000 comprises a first flip-flop 1005 and a second flip-flop 1010. First flip-flop 1005 has a data input and a clock input. Second flip-flop 1010 also has a data input and a clock input. The data input of flip-flop 1005 receives its input signal from the output of third flip-flop 1015. Third flip-flop 1015 has a data input "D1" and a clock input that receives first input clock "C1". The data input of second flip-flop 1010 receives its input signal from the output of fourth flip-flop 1020. Fourth flip-flop 1020 has a data input "D2" and a clock input that receives second input clock "C2". First input clock "C1" is input to the clock input of fifth flip-flop 1025. Fifth flip-flop 1025 also has a data input "D". The output of fifth flip-flop 1025 is input to AND gate 1030. Second input clock "C2" is also input to AND gate 1030. The output of AND gate 1030 is input to the clock inputs on both first flip-flop 105 and second flip-flop 1010.

The first step 100 in the process of resynthesizing gated clocks is to mark the clock cone (see FIG. 1). Examining circuit 1000 shows that the clock inputs to both first flip-flop 1005 and second flip-flop 1010 receive a gated clock. Tracing back from the inputs to first flip-flop 1005 and second flip-flop 1010 leads to the first input clock "C1" and second input clock "C2". Thus, clock cone 1040 includes third flip-flop 1015, fourth flip-flop 1020, fifth flip-flop 1025 and AND gate 1030. The clock inputs to clock cone 1040 are first input clock "C1" and second input clock "C2". The signals comprising clock cone 1040 are gated clock "G", input to AND gate 1030 "Q", first input clock "C1" and second input clock "C2". Likewise, the signals comprising the data signals within the clock cone 1040 are first input clock "C1", second input clock "C2", data input "Q1" to flip-flop 1005 and data input "Q2" to flip-flop 1010.

The second step 200 in the process of resynthesizing gated clocks is to propagate clocks through the clock cone 1040 to create the clocking bit fields. The creation of these bit fields will be discussed with reference to FIG. 8. Thus, clock edges are propagated forward through each primary input clock "C1" and "C2". For each of the signals comprising clock cone 1040, the bit fields discussed above are created. Because there are two primary input clocks in circuit 1000, each bit field will be comprised of eight bits.

Figure 8:
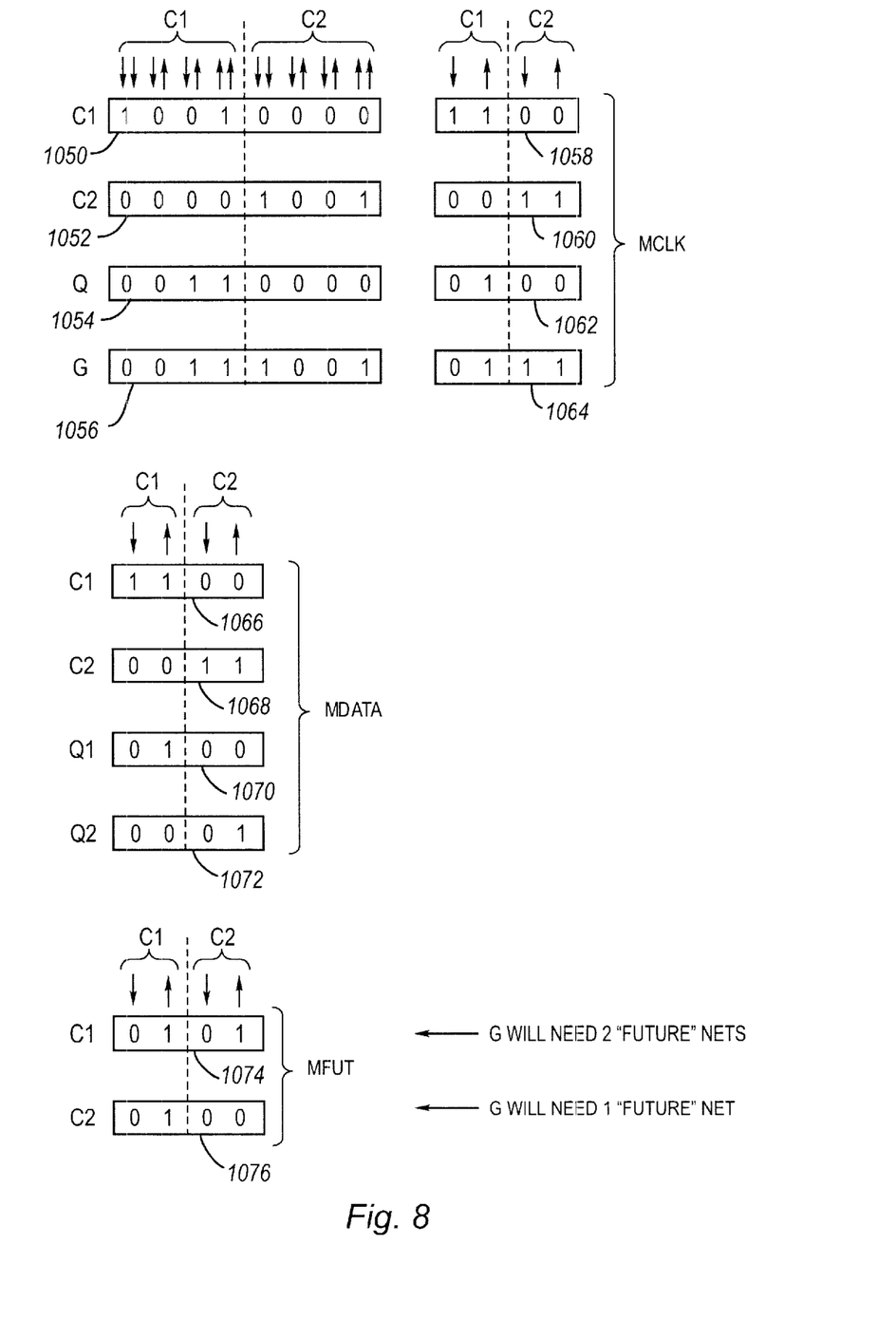
FIG. 8 is a chart showing bit fields for the exemplary circuit design illustrated in FIG. 7.

For first input clock "C1", the bit field 1050 is created. For first input clock "C1", a negative edge will cause a falling edge and a rising edge will cause a rising edge. Likewise, second input clock "C2" can have no impact on first primary input clock "C1". Thus, the bit field 1050, as shown in FIG. 8, comprises "10010000".

For primary input signal "C2", the bit field 1052 is created. For second input clock "C2", first input clock "C1" can have no impact. Thus, the all of the fields relating to first input clock "C1" are set to "0". For second input clock "C2", a falling edge will cause a falling edge and a rising edge will cause a rising edge. Thus, the bit field 1052, as shown in FIG. 8, comprises "00001001".

For signal "Q", the bit field 1054 is created. For the signal "Q", a rising edge of first input clock "C1" might cause either a falling edge or a rising edge on "Q" (i.e., the signal "Q" will become whatever is stored in fifth flip-flop 1025). A falling edge of first input clock "C1" will not cause a transition of signal "Q", since the output of fifth flip-flop 1025 will not change. In contrast, second input clock "C2" will have no effect on the signal "Q". Thus, the bit field 1054, as shown in FIG. 8, comprises "00110000".

For signal "G", the bit field 1056 is created. For the signal "G", a rising edge of first input clock "C1" might cause either a falling edge or a rising edge on "Q" (i.e., the signal "Q" will become whatever is stored in fifth flip-flop 1025, which could cause a transition of the output of AND gate 1030). A falling edge of first input clock "C1" will not cause a transition of signal "G", since the output of fifth flip-flop 1025 will not change. When second input clock "C2" has a negative edge, it might cause the output of AND gate 1030 to create a falling edge. Likewise, when second input clock "C2" has a positive edge, it might cause the output of AND gate 1030 to create a rising edge (i.e., if the signal "Q" is a logic level "1", a rising edge on second input clock "C2" will create a positive edge on signal "G"). Thus, the bit field 1056, as shown in FIG. 8, comprises "00111001".

As discussed, after bit fields 1050, 1052, 1054 and 1056 are created, they are shrunk into two-bit bit field by OR'ing the negative edge fields and OR'ing the positive edge fields. Thus, as shown in FIG. 8, bit field 1050 is shrunk to an Mclk 1058 comprising "1100"; bit field 1052 is shrunk to an Mclk 1060 comprising "0011"; bit field 1054 is shrunk to an Mclk 1062 comprising "0100"; and bit field 1056 is shrunk to an Mclk 1064 comprising "0111".

Once Mclk bit fields 1058, 1060, 1062 and 1064 are created, the next step in the process of resynthesizing gated clocks, step 300 in FIG. 1, is to propagate all signals in the data path to create Mdata bit fields. As discussed, the data signals within the clock cone 1040 comprise first input clock "C1", second input clock "C2", data input "Q1" to flip-flop 1005 and data input "Q2" to flip-flop 1010. For first input clock "C1", Mdata bit field 1066 is created. First input clock "C1" will change on both the rising edge and falling edge of first input clock "C1". Likewise, first input clock "C1" will not change on either a rising or falling edge of second input clock "C2". Thus, as shown in FIG. 8, the Mdata bit field 1066 comprises "1100".

For second input clock "C2", Mdata bit field 1068 is created. Second input clock "C2" will not change on either a rising or falling edge of first input clock "C1". However, second input clock "C2" will change on both the rising edge and falling edge of second input clock "C2". Thus, as shown in FIG. 8, the Mdata bit field 1068 comprises "0011".

For data input "Q1" to flip-flop 1005, Mdata bit field 1070 is created. A falling edge on first input clock "C1" will not cause a change in data input "Q1" because a falling edge will not cause the data stored in third flip-flop 1015 to be output. However, a rising edge on first input clock "C1" may cause a change in the value of data input "Q1" because the data stored in third flip-flop 1015 will be output. This data value may be different than the data value currently on the net "Q1", meaning that change is possible. In contrast, second input clock "C2" will have no impact on the value of data input "Q1". Thus, as shown in FIG. 8, the Mdata bit field 1070 comprises "0100".

For data input "Q2" to flip-flop 1010, Mdata bit field 1072 is created. First input clock "C1" will have no impact on the value of data input "Q2". The same is true for a falling edge on second input clock "C2" because such a falling edge will not cause the data stored in fourth flip-flop 1020 to be output. However, a rising edge on first input clock "C2" may cause a change in the value of data input "Q2" because the data stored in fourth flip-flop 1020 will be output. This data value may be different than the data value currently on the net "Q2", meaning that change is possible. Thus, as shown in FIG. 8, the Mdata bit field 1072 comprises "0001".

Once Mdata bit fields 1066, 1068, 1070 and 1072 are created, the next step in the process of resynthesizing gated clocks, step 400 in FIG. 1, is to iterate through all of the flip-flops and latches (i.e., all sequential logic gates) in the clock cone 1040 and to AND the Mclk bit field for the flip-flop or latch's clock input with Mdata bit field for the flip-flop or latch's data input. Here, gated clock "G" drives first flip-flop 1005 and second flip-flop 1010. Thus, the Mclk bit field and the Mdata bit field for first flip-flop 1005 are AND'ed together and the Mclk bit field and the Mdata bit field for second flip-flop 1010 are also AND'ed together. Because gated clock "G" drives both first flip-flop 1005 and second flip-flop 1010, the results of these AND operations are OR'ed together.

When the Mclk bit field for "G" 1064 is AND'ed with the Mdata bit field 1070 for "Q1", the result is "0100". Likewise, when the Mclk bit field 1064 for "G" is AND'ed with the Mdata bit field 1072 for "Q2", the result is "0001". When these results are OR'ed together, the result is future bit field Mfut 1074, which as seen in FIG. 8, is "0101".

The next part of step 400 is to compare the bit fields Mclk and future bit field Mfut for the gated clocks for every net in the clock path that drives a gated clock (except for primary input clocks). In the present example, the net "Q" drives gated clock "G". The bit field Mclk 1062 for net "Q" is AND'ed with the future bit field Mfut 1074 for gated clock "G". This results in a future bit field Mfut 1076 for net "Q" (since there is only one future bit field Mfut 1074 for gated clock "G", no OR operations are necessary). As above, every "1" in the future bit field Mfut 1076 is indicative of a potential hold time violation.

Thus, the result of step 400 is future bit fields Mfut 1074 and Mfut 1076. Future bit field Mfut 1074 shows that the net "G" will need two future nets because the rising edge of first input clock "C1" and the rising edge of second input clock "C2" may cause a hold time violation. Likewise, the future bit field Mfut 1076 shows that the net "Q" will require one future net because a rising edge on first input clock "C1" may cause a hold time violation.

Figure 9:
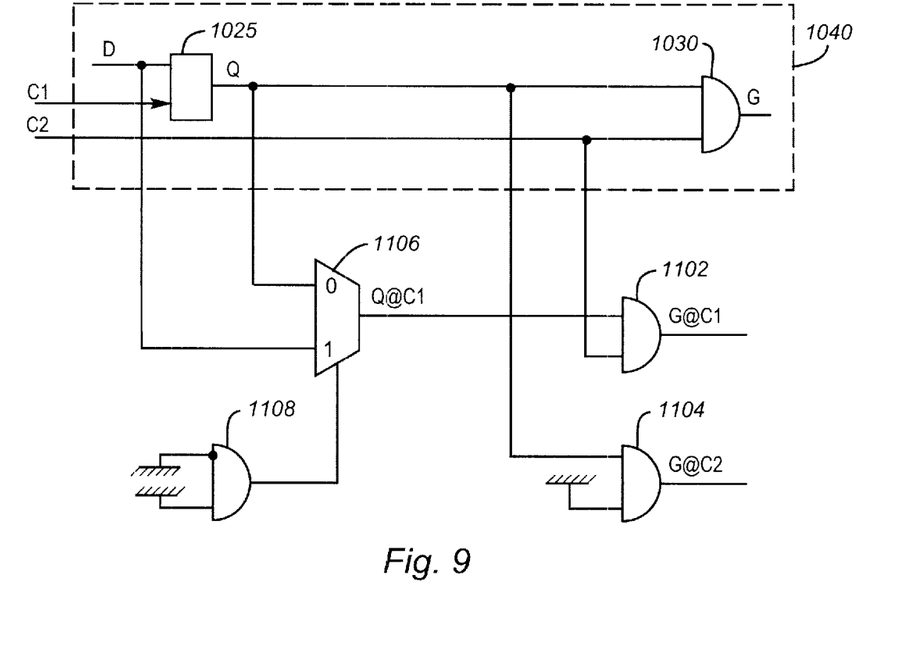
FIG. 9 is logic diagram showing the exemplary circuit design of FIG. 7 after predicting logic has been inserted.

Once the future nets are determined, the next step on the process of resynthesizing gated clocks, step 500 in FIG. 1, is to build predicting logic. As discussed, if a combinational logic gate drove the original net in the user's design, the same type of combinational gate is created for its corresponding "future" net. Referring to FIG. 9, because two-input AND gate 1030 drives gated clock "G", and because the gated clock "G" requires two future nets (one investigating the positive edge of first input clock "C1" and the second investigating the positive edge of second input clock C2"), two-input AND gate 1102 and two-input AND gate 1104 are created. Likewise, because net "Q" is driven by fifth flip-flop 1025, a multiplexer 1106 having a select input driven by an AND gate 1108 is created in the netlist.

Once created, the predicting logic must be connected to the logic in the clock cone 1040. The manner in which this is done for AND gate 1102 is as follows. One of the inputs to AND gate 1030 is the net "Q". It is known from the future bit field Mfut 1076 that net "Q" has one future net for first input clock "C1". Thus, one of the inputs to AND gate 1102 is the future net from predicting logic generated for net "Q". Another of the inputs to AND gate 1102 is second input clock "C2", which has no future nets. Thus, second input clock "C2" is also input to AND gate 1030. The output of AND gate 1102 is the future net "G@C1", which will be eventually connected to a gated clock resolution circuit.

The manner in which AND gate 1104 is connected to clock cone 1040 in this example is as follows. One of the inputs to AND gate 1030 is the net "Q". It is known from the future bit field Mfut 1076 that net "Q" has no future nets for first input clock "C2". Thus, one of the inputs to AND gate 1104 can simply be connected to net "Q". Since AND gate 1104 is used to predict hold time violation behavior for the rising edge of second input clock "C2", the second input to AND gate 1104 can simply be set to high, for example, connecting it to Vcc, as shown in FIG. 9. The output of AND gate 1104 is the future net "G@C2", which will eventually input to a gated clock resolution circuit.

The manner in which the predicting logic for fifth flip-flop 1025, multiplexer 1106 having a select input driven by an AND gate 1108, is connected to the clock cone 1040 will now be discussed. As discussed above in relation to FIG. 4b, the output "Q" of fifth flip-flop 1025 is connected to the first data input of multiplexer 1106 and the input "D" to fifth flip-flop 1025 is connected to the second data input of multiplexer 1106. As also discussed in relation to FIG. 4b, the select input to multiplexer 1106 is connected to the output of AND gate 1108. The inputs to AND gate 1108 are as follows. As seen above when discussing FIG. 4b, a first input to AND gate 1108 is the inverted first input clock "C1". However, because it is known from the future bit field Mfut 1076 that net "Q" has one future net for first input clock "C1", and that this future net is concerned with the rising edge of first input clock "C1", the various embodiments of the present invention want to ensure that the value of "D" is always output from multiplexer 1106. This is because a rising edge on first input clock "C1" will always result in the input "D" to fifth flip-flop 1025 being placed on the output "Q". Thus, a first input to AND gate 1108 is grounded (which ensures that a "1" is placed on the input to AND gate 1108) and a second input to AND gate 1108 is a "1", e.g., Vcc. Such connections ensure that AND gate 1108 always outputs a "1", which results in multiplexer 1106 always outputting the input "D". The output of multiplexer 1106 is the future net "Q@C1", which will eventually be input to a gated clock resolution circuit.

Figure 10:
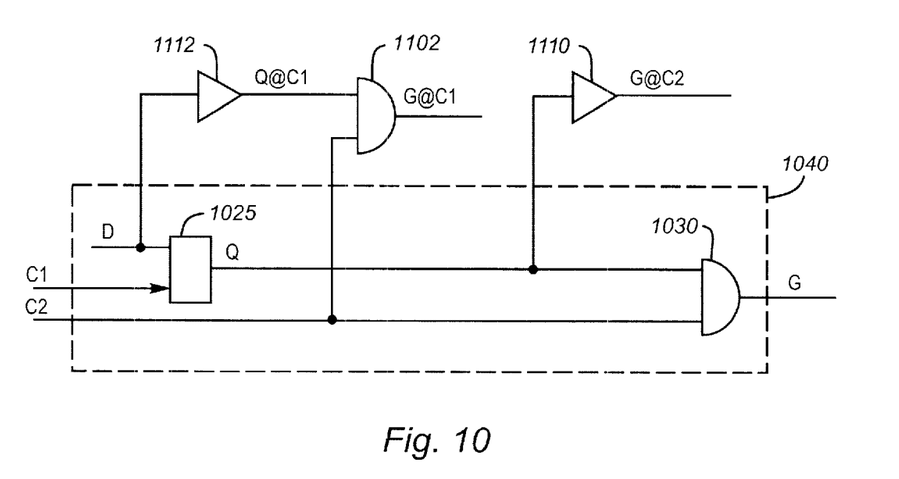
FIG. 10 is logic diagram showing the logic diagram of FIG. 9 after it has been optimized.

In the presently preferred embodiments, the predicting logic (e.g., AND gates 1102 and 1104, and multiplexer 1106 and AND gate 1108) can be optimized to minimize the amount of logic inserted into the netlist. The result of such an optimization is shown in FIG. 10. Because the output of multiplexer 1106, "Q@C1" will always be the input "D" to fifth flip-flop 1025, AND gate 1108 and multiplexer 1106 can be replaced with a buffer 1112, the output of which is input to AND gate 1102. AND gate 1102 cannot be optimized. Finally, because the output of AND gate 1104, "G@C2", will always be output "Q" or fifth flip-flop 1025, AND gate 1104 can be replaced with buffer 1110, the input of which is connected to "Q".

Once the predicting logic is created, connected to the clock cone 1040 and optimized, the next step on the process of resynthesizing gated clocks, step 600 in FIG. 1, is to build a gated clock resolution circuit. The manner in which this is done will be demonstrated with reference to FIG. 5 and FIG. 11. As discussed with respect to FIG. 5, the outputs of the predicting logic are connected to AND gates, with these AND gates then driving the enable inputs of flip-flops. As seen in FIG. 10, the predicting logic created for this example outputs future nets "G@C1", "G@C2" and "Q@C1". However, as discussed, the optimized predicting logic was optimized, which rendered future net "Q@C1" unecessary. As discussed with reference to FIG. 8, the future nets "G@C1" and "G@C2" are for the rising edges of input clocks C1 and C2, respectively.

Using the gated clock resolution circuit seen in FIG. 5, future net "G@C1" is connected to an input of AND gate 232. Another input to AND gate 232 is the inverted gated clock "G". The output of AND gate 232 is input to the enable input of flip-flop 230. The remaining inputs to flip-flop 230 are the same as those discussed above with respect to FIG. 5. The output of flip-flop 230 is input to OR gate 215. Likewise, the future net "G@C2" is connected to an input of AND gate 236. Another input to AND gate 236 is the inverted gated clock "G". The output of AND gate 236 is input to the enable input of flip-flop 234. The remaining inputs to flip-flop 234 are the same as those discussed above with respect to FIG. 5. The output of flip-flop 234 is input to OR gate 215. The output of OR gate 215 is input to the set input of RS trigger 270. Flip-flop 266 is connected as discussed with respect to the discussion of FIG. 5 above.

The inputs to the AND gates 252 and 256 are also made in the same manner as discussed above. Thus, the future net "G@C1" is connected to an input of AND gate 252 and inverted. Another input to AND gate 252 is the gated clock "G". The output of AND gate 252 is input to the enable input of flip-flop 250. The remaining inputs to flip-flop 250 are the same as those discussed above with respect to FIG. 5. The output of flip-flop 250 is input to OR gate 225. Likewise, the future net "G@C2" is connected to an input of AND gate 256 and inverted. Another input to AND gate 256 is the gated clock "G". The output of AND gate 256 is input to the enable input of flip-flop 254. The remaining inputs to flip-flop 254 are the same as those discussed above with respect to FIG. 5. The output of flip-flop 254 is input to OR gate 225. The output of OR gate 225 is input to the set input of RS trigger 270. Flip-flop 266 is connected as discussed with respect to the discussion of FIG. 5 above.

Figure 11:
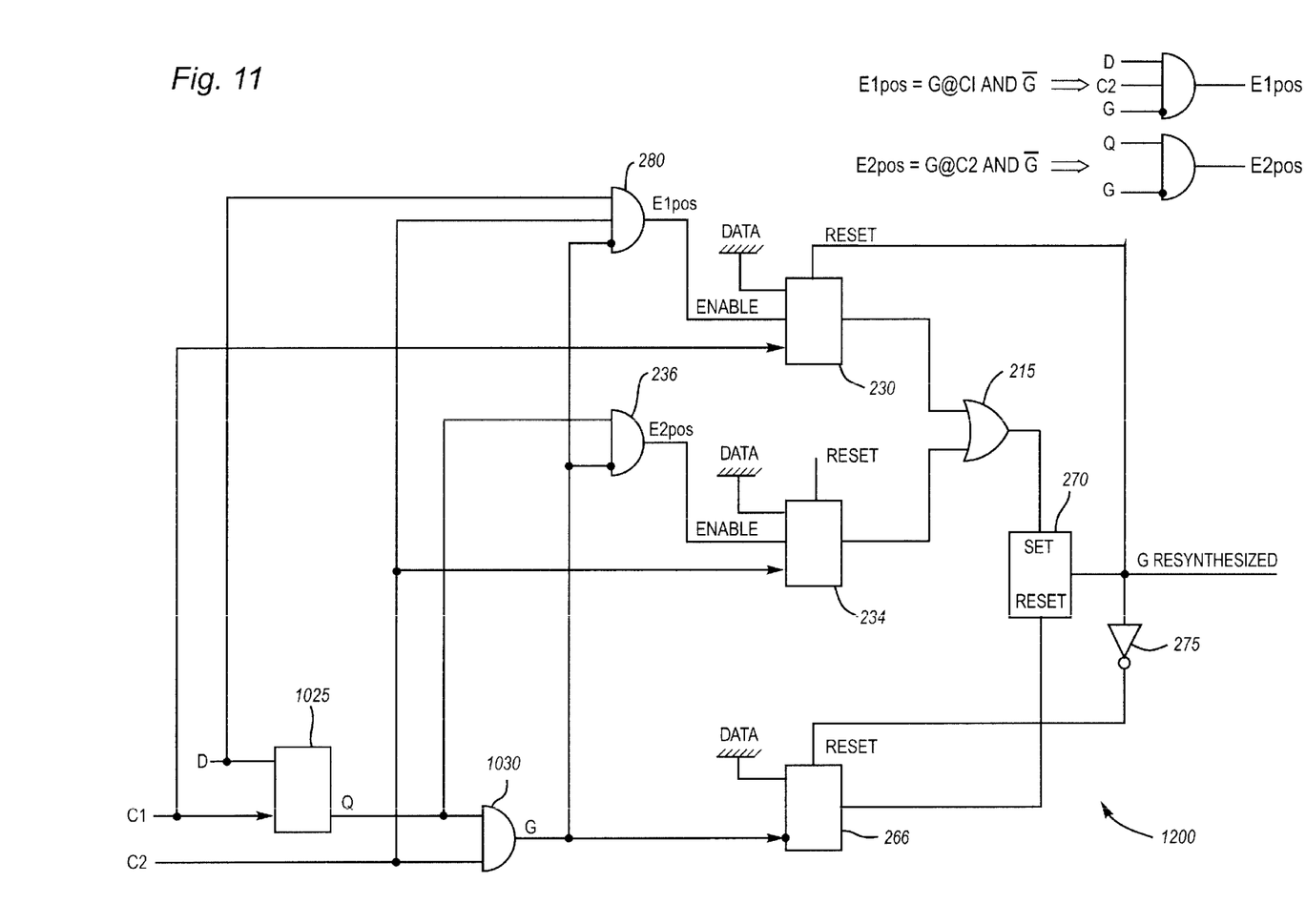
FIG. 11 is a logic diagram showing how the gated clock of the example shown in FIG. 7 is resynthesized by connecting optimized logic circuit from FIG. 10 to a gated clock resolution circuit.

As discussed above, the gated clock resolution circuit can be optimized to reduce the amount of logic needed. The optimized gated clock resolution circuit 1200 for this example is shown in FIG. 11. Because the input to AND gate 232 is the output from AND gate 1102, AND gate 1102 and AND gate 232 can be combined to form a single AND gate 280. The inputs to AND gate 280 are the input "D" to flip-flop 1025, second input clock "C2" (which were the inputs to AND gate 1102) and, after inversion, gated clock "G". Turning to AND gate 236, because the future net "G@C2" is simply the output "Q" from flip-flop 1025 passed through buffer 1110, buffer 1110 can be eliminated. Thus, the inputs to AND gate 236 are the output "Q" from flip-flop 1025 and the inverted gated clock "G". In addition, because the future nets "G@C1" and "G@C2" are inverted, the outputs of AND gates 252 and 256 will always be "0", meaning that during optimization, AND gates 252 and 256, along with flip-flops 250 and 254 can be eliminated. Flip-flop 266 remains after optimization.

Figure 12:
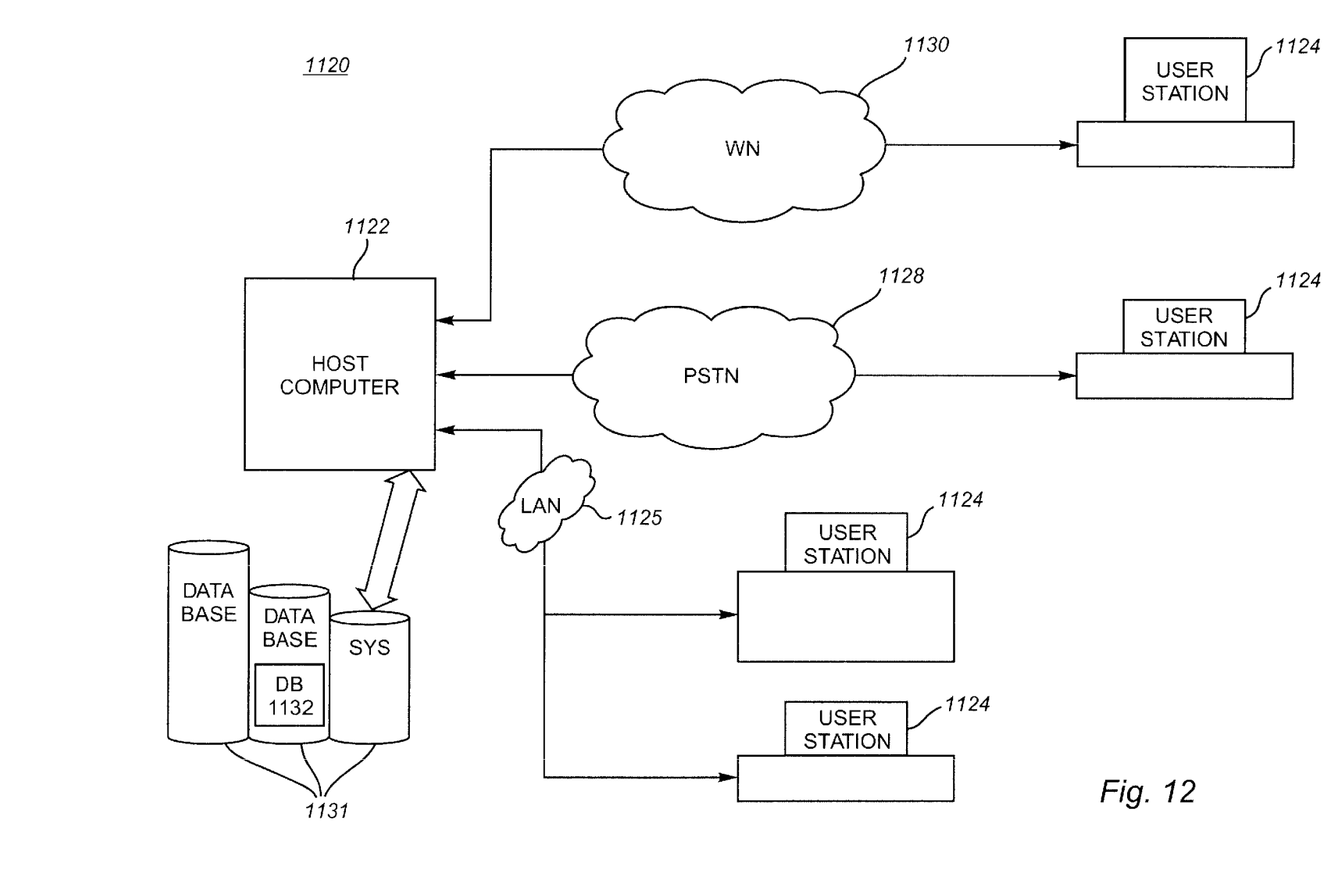
FIG. 12 is a block diagram of a computer system constructed in accordance with one preferred embodiment of the present invention.

Referring to FIG. 12, a computer system 1120 constructed in accordance with one preferred embodiment of the present invention includes a host computer 1122 connected to a plurality of individual user stations 1124. The user stations 1124 each comprise suitable data terminals, such as, e.g., personal computers, portable laptop computers, or personal data assistants ("PDAs"), which can store and independently run one or more applications, i.e., programs. For purposes of illustration, some of the user stations 1124 are connected to the host computer 1122 via a local area network ("LAN") 1125. Other user stations 1124 are remotely connected to the host computer 1122 via a public telephone switched network ("PSTN") 1128 and/or a wireless network 1130.

The host computer 1122 operates in conjunction with a data storage system 1131, which contains a database 1132 that is readily accessible by the host computer 1122. In alternative embodiments, the database 1132 may be resident on the host computer, stored, e.g., in the host computer's ROM, PROM, EPROM, or any other memory chip, and/or its hard disk. In yet alternative embodiments, the database 1132 may be read by the host computer 1122 from one or more floppy disks, flexible disks, magnetic tapes, any other magnetic medium, CD-ROMs, any other optical medium, punchcards, papertape, or any other physical medium with patterns of holes, or any other medium from which a computer can read. In further alternative embodiments, the host computer 1122 can access two or more databases 1132, stored in a variety of mediums, as previously discussed.

Figure 13:
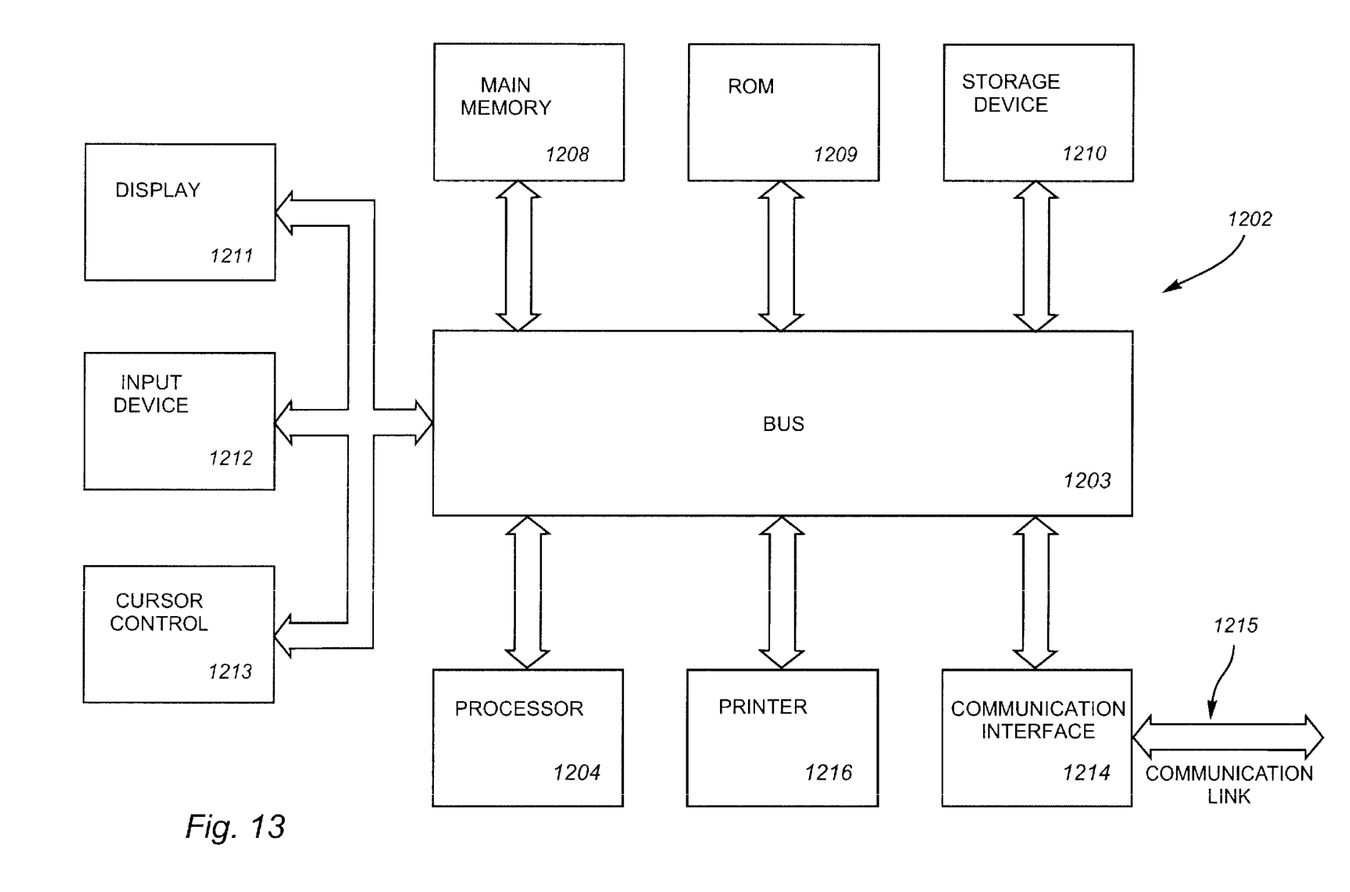
FIG. 13 is a block diagram of a processing unit constructed in accordance with one preferred embodiment of the present invention.

Referring to FIG. 13, each user station 1124 and the host computer 1122 can be referred to generally as a processing unit 1202. The processing unit 1202 includes a bus 1203 or other communication mechanism for communicating instructions, messages and data, collectively, information, and one or more processors 1204 coupled with the bus 1203 for processing information. The processing unit 1202 also includes a main memory 1208, such as a random access memory (RAM) or other dynamic storage device, coupled to the bus 1203 for storing dynamic data and instructions to be executed by the processor(s) 1204. The main memory 1208 also may be used for storing temporary data, i.e., variables, or other intermediate information during execution of instructions by the processor(s) 1204.

The processing unit 1202 further includes a read only memory (ROM) 1209 or other static storage device coupled to the bus 1203 for storing static data and instructions for the processor(s) 1204. A storage device 1210, such as a magnetic disk or optical disk, is also provided and coupled to the bus 1203 for storing data and instructions for the processor (s) 1204. An output device such as a printer 1216 is also provided and coupled to the bus 1203, for outputting information to the user.

The processing unit 1202 is also coupled via the bus 1203 to a display device 1211, such as, but not limited to, a cathode ray tube (CRT), for displaying information to a user. An input device 1212, including alphanumeric and other keys, is coupled to the bus 1203 for communicating information and command selections to the processor(s) 1204. Another type of user input device may include a cursor control 1213, such as, but not limited to, a mouse, a trackball, a fingerpad, or cursor direction keys, for communicating direction information and command selections to the processor(s) 1204 and for controlling cursor movement on the display 1211.

The individual processing units 1202 perform specific operations by their respective processor(s) 1204 executing one or more sequences of one or more instructions contained in the main memory 1208. Such instructions may be read into the main memory 1208 from another computer-usable medium, such as the ROM 1209 or the storage device 1210. Execution of the sequences of instructions contained in the main memory 1208 causes the processor(s) 1204 to perform the processes described herein. In alternative embodiments, hard-wired circuitry may be used in place of or in combination with software instructions to implement the invention. Thus, embodiments of the invention are not limited to any specific combination of hardware circuitry and/or software.

The term "computer-usable medium," as used herein, refers to any medium that provides information or is usable by the processor(s) 1204. Such a medium may take many forms, including, but not limited to, non-volatile, volatile and transmission media. Non-volatile media, i.e., media that can retain information in the absence of power, includes the ROM 1209. Volatile media, i.e., media that can not retain information in the absence of power, includes the main memory 1208. Transmission media includes coaxial cables, copper wire and fiber optics, including the wires that comprise the bus 1203. Transmission media can also take the form of carrier waves; i.e., electromagnetic waves that can be modulated, as in frequency, amplitude or phase, to transmit information signals. Additionally, transmission media can take the form of acoustic or light waves, such as those generated during radio wave and infrared data communications.

Common forms of computer-usable media include, for example: a floppy disk, flexible disk, hard disk, magnetic tape, any other magnetic medium, CD-ROM, any other optical medium, punchcards, papertape, any other physical medium with patterns of holes, RAM, ROM, PROM (i.e., programmable read only memory), EPROM (i.e., erasable programmable read only memory), including FLASH-EPROM, any other memory chip or cartridge, carrier waves, or any other medium from which a processor 1204 can retrieve information.

Various forms of computer-usable media may be involved in providing one or more sequences of one or more instructions to the processor(s) 1204 for execution. For example, the instructions may initially be provided on a magnetic disk of a remote computer (not shown). The remote computer may load the instructions into its dynamic memory and then transit them over a telephone line, using a modem. A modem local to the processing unit may receive the instructions on a telephone line and use an infrared transmitter to convert the instruction signals transmitted over the telephone line to corresponding infrared signals. An infrared detector (not shown) coupled to the bus 1203 may receive the infrared signals and place the instructions therein on the bus 1203. The bus 1203 may carry the instructions to the main memory 1208, from which the processor(s) 1204 thereafter retrieves and executes the instructions. The instructions received by the main memory 1208 may optionally be stored on the storage device 1210, either before or after their execution by the processor(s) 1204.

Each processing unit 1202 also includes a communication interface 1214 coupled to the bus 1203. The communication interface 1214 provides two-way communication between the processing units 1202 (such as, e.g., between a user station 1124 and the host computer 1122) via a communication link 1215. The communication interface 1214 of a respective processing unit 1202 transmits and receives electrical, electromagnetic or optical signals that include data streams representing various types of information, including instructions, messages and data.

The communication link 1215 may be a LAN 1125, in which case the communication interface 1214 may be a LAN card. Alternatively, the communication link 1215 may be a PSTN 1128, in which case the communication interface 1214 may be an integrated services digital network (ISDN) card or a modem. Also, as a further alternative, the communication link 1215 may be a wireless network 1130.

Each processing unit 1202 transmits and receives messages, data, and instructions, including program, i.e., application, code, through its respective communication link 1215 and communication interface 1214. Received program code may be executed by the respective processor(s) 1204 as it is received, and/or stored in the storage device 1210, or other associated non-volatile media, for later execution. In this manner, a processing unit may receive messages, data and/or program code in the form of a carrier wave.

Thus, various embodiments of the present invention have been described with reference to specific embodiments. It will, however, be evident that various modifications and changes may be made thereto without departing from the broader spirit and scope of the invention. For example, the reader is to understand that the specific ordering and combination of process actions shown in the process flow diagrams described herein is merely illustrative, and the invention can be performed using different or additional process actions, or a different combination or ordering of process actions. The specification and drawings are, accordingly, to be regarded in an illustrative rather than restrictive sense, and the invention is not to be restricted or limited except in accordance with the following claims and their legal equivalents.

I claim:

1. A method of resynthesizing gated clocks in a clock cone of a logic design for implementation in a hardware logic emulation system to avoid hold time violations, the clock cone comprising a plurality of clock cone nets and at least one input clock, the logic design comprising a plurality data path nets, comprising:

generating predicting logic that predicts which edges of said at least one input clock can cause a hold time violation on a gated clock; and connecting outputs from said predicting logic to a gated clock resolution circuit, said gated clock resolution circuit outputting a resynthesized gated clock free of hold time violations.

2. The method of claim 1 wherein the generating predicting logic step further comprises:

creating a bit field corresponding to each of the plurality of clock cone nets, said bit field comprising data fields indicating potential behavior of said corresponding net in response to a rising edge of said at least one input clock and a falling edge of said at least one input clock;

creating a data path bit field corresponding to each of the data path nets, said data path bit field comprising data fields indicating whether a positive edge of one of the at least one input clock may cause a change on the data path nets or whether a negative edge of one of the at least one input clock may cause a change on the data path nets;

comparing said bit field corresponding to each of the plurality of clock cone nets with said data path bit field for each storage element in the logic design, thereby creating a future bit field, said future bit field containing data indicating whether a net is susceptible to a hold time violation for the particular edge of one of the at least one input clock or is not susceptible to a hold time violation for the particular edge of one of the at least one input clock; and building said predicting logic for each net that is susceptible to a hold time violation.

3. One or more processor readable storage devices having processor readable code embodied on said processor readable storage devices, said processor readable code for programming one or more processors to resynthesize gated clocks in a clock cone of a logic design for implementation in a hardware logic emulation system to avoid hold time violations, the clock cone comprising a plurality of clock cone nets and at least one input clock, the logic design comprising a plurality data path nets, the one or more processors being programmed to perform a method comprising the steps of:

generating predicting logic that predicts which edges of said at least one input clock can cause a hold time violation on a gated clock; and connecting outputs from said predicting logic to a gated clock resolution circuit, said gated clock resolution circuit outputting a resynthesized gated clock free of hold time violations.

* * * * *